United States Patent [19]

Ogawa

[11] Patent Number: 4,522,680

[45] Date of Patent: Jun. 11, 1985

[54] METHOD FOR PRODUCING CRYSTALS

[75] Inventor: Kazufumi Ogawa, Hirakata, Japan

[73] Assignee: Matsushita Electric Industrial Co., Ltd., Japan

[21] Appl. No.: 485,506

[22] Filed: Apr. 15, 1983

[30] Foreign Application Priority Data

Apr. 15, 1982 [JP] Japan .................................. 57-63744
Oct. 19, 1982 [JP] Japan ................................ 57-183959

[51] Int. Cl.$^3$ ............................................. B01J 3/06
[52] U.S. Cl. .................................. 156/624; 423/446;
423/509; 423/561 B; 156/DIG. 68;
156/DIG. 72; 156/DIG. 80; 156/603;
204/157.1 H
[58] Field of Search ..................... 423/446, 509, 561 B;
156/DIG. 68, 603, DIG. 72, DIG. 80, 624;
204/157.1 L, 157.1 R

[56] References Cited

U.S. PATENT DOCUMENTS 3,661,526 5/1972 Angus et al. ........................ 423/446
3,897,590 7/1975 Gürs .................................... 156/620

FOREIGN PATENT DOCUMENTS 1008618 10/1965 United Kingdom ................ 423/446

OTHER PUBLICATIONS

Ming et al., Rev. Sci. Instrum., vol. 45, No. 9 (Sep. 1974) pp. 1115-1118.

Primary Examiner—William R. Dixon, Jr.
Assistant Examiner—Steven Capella
Attorney, Agent, or Firm—Lowe, King, Price & Becker

[57] ABSTRACT

A method for producing crystals of materials is described. The method comprises providing a pressure-resistant body having a nucleus of a starting material being crystallized in the inside thereof. The nucleus is applied with an energy which is capable of passing through the pressure-resistant body and being absorbed by the starting material, by which the nucleus is heated and melts. The melt is then gradually cooled under pressure to form crystals of the material. A laser beam or high frequency induction heating technique is used for heating the nucleus.

11 Claims, 3 Drawing Figures

METHOD FOR PRODUCING CRYSTALS

FIELD OF THE INVENTION

This invention relates to a method for producing crystals from materials of the type which will require super-high temperature and pressure conditions upon production of the crystals. The present invention is useful in producing jewels such as artificial diamond, sapphire and ruby, crystals of various metal compounds and the like.

DESCRIPTION OF THE PRIOR ART

Known techniques of producing single crystals can broadly be classified into five categories including (1) flame fusion method, (2) hydrothermal crystallization method, (3) flux method, (4) Czchralski method, and (5) zone melting method.

The flame fusion method is also called Verneui's method in which a starting oxide powder is dropped through a screen and is melted in oxyhydrogen flame of a burner, followed by dropping in a container where it crystallizes to give a single crystal boule. However, this method is disadvantageous in that although starting materials of high purity are used, the resulting crystals are not of high quality.

In case where the hydrothermal crystallization method is used to make, for example, ruby, alpha-alumina and 0.18 g/l of sodium chromate are charged into a pressure-resistant container along with 1-2N $Na_2CO_3$ or 0.5N NaOH aqueous solution and seed crystals of ruby are suspended in the container. When the alumina is heated under a pressure of about 2000 atms., it is melted and crystals grow around the suspended seed crystals at a growing rate of about 0.05-0.25 mm/hr. However, this method requires a large-scale apparatus with the production efficiency being very poor.

According to the flux method, pink ruby crystals can be formed, for example, by mixing aluminium oxide with equal amounts of lead oxide and lead fluoride serving as a flux and heating the mixture to about 1250° C., and cooling the resultant melt at a rate of 0.11-1° C./min to form alumina crystals. The alumina crystals are immersed in sodium chromate to obtain pink ruby crystals. However, this method has the drawback that ruby cannot stably be obtained because of changes in composition and viscosity of the flux.

The Czchralski method is a method in which starting materials are melted in crucible and seed crystals are immersed in the melt and drawn up. The zone melting method is a method in which starting materials are shaped in the form of a rod and the rod is locally heated for recrystallization by induction heating. Single crystals are formed over the entire rod while moving the melting zone. This method has been reduced to practice for the production of single crystals of Si. However, no technique of producing single crystals under super-high pressure has been developed yet.

Thus, any prior methods discussed above are not useful in producing crystals such as of diamond which require very high temperature and pressure conditions.

For instance, synthesis of diamond needs conditions of tens of thousands atmospheric pressures and temperatures over 2000° C. It is very difficult to maintain these severe conditions over a certain period of time. Accordingly, there are proposed methods using catalysts such as iron-nickel, germanium-nickel, nickel-chromium and the like. However, these methods still need relatively severe conditions of 3-5 tens of thousands atmospheric pressures and over 1000° C. With apparatus which can withstand such high temperature and high pressure as mentioned, a charge of starting materials is limited only to about 10 g at a time and the resultant crystals have a size as small as about 1 mm. In addition, the apparatus becomes too large in scale.

SUMMARY OF THE INVENTION

It is accordingly an object of the present invention to provide a method for producing expensive crystals of materials by a very simple energy-saving manner under high temperature and high pressure conditions.

It is another object of the invention to provide a method for producing crystals such as of artificial diamond or useful metal compounds with a reduced loss of heating energy.

It is a further object of the invention to provide a method for producing crystals of materials which cannot be melted under a normal pressure because of high vapor pressure at high temperatures.

According to the present invention, there is provided a method for producing crystals of a material which comprises providing a starting material for crystallization completely surrounded by a pressure-resistant body, applying to the starting material from outside of the pressure resistant body an energy capable of passing through the body and being absorbed by the starting material until the starting material is heated and melted whereby a high internal pressure produced by expansion of the starting material is imposed on the melt, and cooling the melt under the high internal pressure thereby forming crystals of the starting material.

Preferably, the pressure-resistant body is substantially in the form of a sphere and the starting material is positioned approximately at the center of the sphere as a nucleus. The pressure-resistant body may be made of quartz, transparent glasses such as quartz glass or the like when laser beam is used as the energy for melting starting materials. Alternatively, the body may be made of magnetic-permeable materials such as $Al_2O_3$, $Si_3N_4$ and the like. In this case, high frequency induction heating is used instead of laser beam and the starting material should be electrically conductive.

DETAILED DESCRIPTION AND EMBODIMENTS OF THE INVENTION

Figure 1:
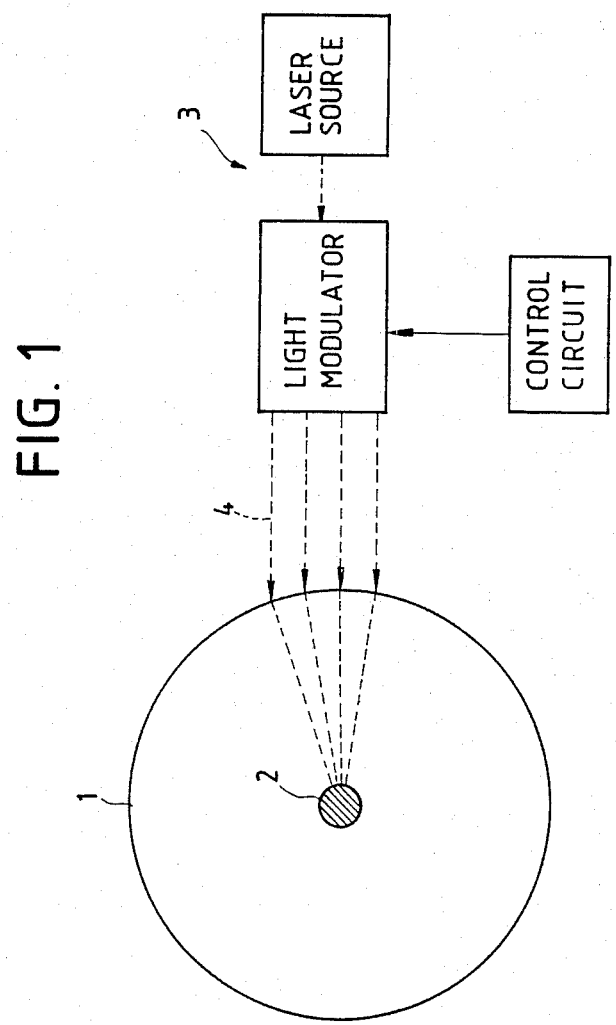
FIG. 1 is a schematic view showing one embodiment of the invention using laser beam.

Referring to the accompanying drawings and particularly to FIG. 1, there is shown a heat-resistant body 1 substantially in the form of a sphere which contains a starting material 2 for crystallization approximately at the center of the body 1. The body is transparent to a laser beam and is made of quartz, a transparent glass or the like, diamond. The starting material 2 included within the body 1 as a nucleus is pressurized for the reason described hereinafter. A laser beam generator 3 including a laser source, a light modulator and a control circuit for the modulator is provided at the outside of the body 1. When the generator 3 is turned on, a laser beam 4 such as $CO_2$ laser beam or YAG laser beam generates and is focussed on the starting material 2 through the transparent body 1. By this, the material 2 is heated and melted. That is, the laser beam 4 is able to pass through the transparent body and is absorbed by the material 2. The material 2 is thus heated whereupon it expands and vaporizes. On the other hand, the heat-resistant body 1 is not directly heated and is made of a material which is poor in thermal conductivity, so that it is hardly heated and expanded except for portions which contact with the starting material 2 or thereabouts. Thus, the material 2 is maintained at high temperatures under high pressure conditions which are created by the thermal expansion and vaporization of the heated material 2 and the pressure-resistant body 1 in portions contacting with or near the heated material 2. Power of the laser beam 4 is then lowered or tuned off so as to gradually cool the melt of the material 2. As a result, the melt is gradually cooled from outside under high temperature and high pressure conditions to form crystals. It will be noted that because the body 1 is not directly heated, it does not melt or break. Finally, the crystals are obtained by removing the body 1.

The above procedure is more particularly described with regard to manufacture of artificial diamond.

EXAMPLE 1

Manufacture of artificial diamond is usually effected under conditions of 300,000 atms. and 3000° K.

10 g of graphite which is molded under pressure in the form of a sphere is provided as the starting material 1 and covered with powdered glass in a mold capable of yielding a spherical body. The glass-covered graphite is then heated to a temperature at which the glass powder melts. The glass melt is then cooled and hardened to obtain a spherical transparent glass body having a nucleus of the graphite therein. Alternatively, the glass body may be made by inserting the graphite sphere into melted glass, followed by cooling and hardening. Upon cooling of the glass melt, a pressure of several thousands atms. is imposed on the graphite sphere by contraction of the glass body. In this instance, the graphite sphere has a diameter of about 2 cm. In order to allow the glass body to withstand very high internal pressures, the glass body has preferably a diameter exceeding 20 cm. In other words, the size of the nucleus for crystallization is preferably 1/10 time or less the size of the surrounding body. In order to melt the graphite sphere, YAG laser beam of 10 KW is focussed on the sphere from outside for several seconds to several minutes, by which the graphite sphere is heated to over 3000° C. and melts. The surrounding body 1 is made of a glass, e.g. Pyrex 7740 by Corning Glass Works, and is thus poor in thermal conductivity. At least the outer surface or layer of the body 1 does neither melt nor undergo thermal expansion upon application of the beam on the order of several minutes. Provided that the diameter of the spherical glass body is over about ten times the diameter of the graphite sphere, the pressure exerted on the glass sphere surface is about 3000 atms. even when the internal pressure reaches 300,000 atms. The glass sphere does not break when taking into account a Young modulus of glass of $6-8 \times 10^3$ kg/cm$^2$. Output power for the laser beam is reduced until the graphite sphere is cooled to about 2000° C. Thereafter, the sphere is allowed to stand for cooling thereby obtaining artificial diamond as usual.

In the above embodiment, although the pressure-resistant body is made of a transparent glass, any other pressure-resistant materials may be used provided that they are transparent to a laser beam used. If visible light laser beams are used, quartz, and transparent glasses may be used to make the heat-resistant body. On the other hand, when infrared laser beams such as carbonic acid laser beam (wavelength 10.6 um) are used, a compound of the formula $TlBr_xI_y$ in which $x+y=1$ can be used.

In the above embodiment, the surrounding body 1 is monolithic but may not have a monolithic structure if the internal pressure is held without a loss. In this connection, the body 1 is not necessarily made entirely of one material. It is sufficient that at least a portion through which laser beam can pass is formed of a material which is transparent to the laser beam. Examples of the materials include quartz, transparent glasses, diamond, sapphire and the like. For instance, these materials are suitably shaped and incorporated into a body of a suitable form made of metals or ceramics. Further, the surrounding body and the nucleus material are illustrated as spheres but it is not necessarily required to make them spherical. Other forms such as an ellipsoid, a cylinder and the like may be used, if necessary, though spheres are favorably used.

In order to allow the surrounding body to withstand an internal pressure over 300,000 atms., the body should have a size of at least ten times greater than a size of the nucleus. However, the size of the body varies according to the internal pressure used. For instance, if metal compounds are used as a nucleus material, they melt at much lower temperature than graphite, resulting in lower internal pressures. This premits use of a body of a smaller size or diameter. Accordingly, the size or diameter of the surrounding body should be determined depending on the pressure required by the type of material used as nucleus.

Figure 2:
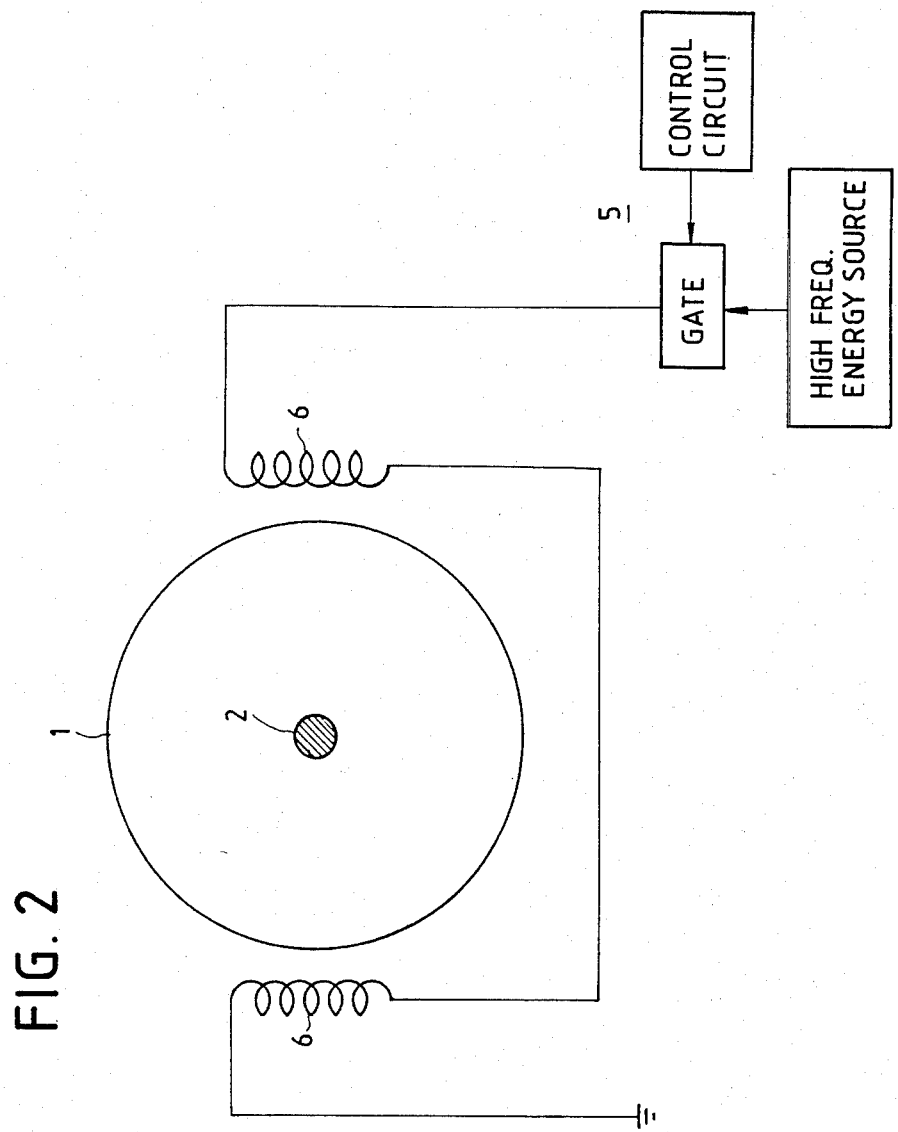
FIG. 2 is a schematic view showing another embodiment of the invention using a high frequency induction heating technique.

In accordance with another embodiment of the invention shown in FIG. 2, the surrounding body 1 is made of a material of magnetic permeability which is not permeable to laser beam. In this case, a high frequency induction heating system 4 having a high frequency energy source, a gate and a control circuit therefor as diagrammatically shown in the figure and also a pair of induction coils 6 is used to heat and melt the nucleus material being crystallized. The melt is then cooled thereby permitting the nucleus material to crystallize. The nucleus material which is effectively treated by this technique should be electrically conductive and includes, for example, graphite. The material of magnetic permeability constituting the body 1 is, for example, $Al_2O_3$, $Si_3N_4$ or the like.

As will be appreciated from the foregoing description, only nucleus materials being crystallized are heated and thus heat energy can be saved to a greater extent than in the case of prior art techniques. The pressure-resistant surrounding body is not directly heated, so that materials which are not so high in heat resistance can be used to make the body. Further, starting nucleus materials are heated and melted within a pressure-resistant body and thus high temperature and high pressure conditions required for crystallization of the materials can be relatively easily obtained by selfexpansion and vaporization of the nucleus materials. It will be noted that when starting materials for crystallization are molded so that a given degree of porosity is imparted to the resulting molding, it is possible to arbitrarily control the internal pressure.

Especially when artificial diamond is produced, catalysts may be admixed with starting materials to make crystals at lower temperatures. Examples of the catalysts include Fe, Ni, Cr, Mn, Co, Ru, Rh, Pd, Os, Ir, Pt, Ta, Inconel or carbides, sulfides and nitrides thereof as ordinarily used for this purpose.

In the first embodiment, heating of a starting material 2 to higher temperatures results in a greater loss of radiant energy released from the heated material 2. For instance, when artificial diamond is produced without use of catalysts according to the first embodiment, starting graphite must be treated under conditions of about 300,000 atms. and 3000° K. To this end, YAG laser of about 10 KW is necessary when 10 g of graphite is used as starting material. This is because heat radiation reaches 460 W/cm$^2$ at 3000° K. In order words, most of the laser beam is lost as radiant heat released from the starting material which has been heated.

According to a third embodiment of the invention, there is provided a round concave mirror 7 having windows 8 which are transparent to laser beams. The round mirror 7 completely covers therewith the pressure-resistant body 1 in a spaced relationship. The laser beam 4 is applied through the windows 8 to the starting material 2, by which the material 2 is heated and melts. The concave mirror 7 is so designed that radiant heat released from the heated material 2 to the outside of the body 1 is almost reflected at the inner surface of the concave mirror 7 and focussed on the material 2. Power consumption for the laser beam can drastically be saved because little beam energy is lost as released to outside. After the starting material 2 has been completely melted, the application of the laser beam is stopped to gradually cool the melt under high temperature and high pressure conditions thereby forming crystals of the starting material. The pressure-resistant body 1 does scarcely absorb the laser beam and is heated only by thermal conduction by contact with the starting material 2, so that its outer surface is maintained at low temperatures, say, room temperature provided that the beam application is within several minutes. The concave mirror 7 covering the body 1 does not rise in temperature because of reflection of most heating rays. In case where it is necessary to expose a starting material to long-term laser irradiation, the surface of the pressure-resistant body and the concave mirror increase in temperature. In this case, a high pressure cooling gas may pass through a space established between the body 1 and the concave mirror 7 to prevent the body 1 and the concave mirror 7 from breakage due to the rise in temperature.

EXAMPLE 2

Similar to Example 1, 10 g of graphite is shaped under pressure to have a spherical form and covered with glass powder, followed by heating to melt the glass powder and cooling to obtain a transparent glass sphere having the graphite nucleus substantially at the center thereof. The glass body should preferably have a diameter of at least 10 times greater than the diameter of the nucleus. Then, a round concave mirror having a window is covered entirely over the glass body and YAG laser beam of 1-2 KW is irradiated through the window. As a result, the graphite melts over 3000° C. within several tens seconds. Thereafter, the laser irradiation is stopped for cooling. The body is cooled from outside while keeping the melt under high pressure thereby obtaining diamond crystals.

As will be apparent from the above example, the use of the concave mirror reduces the laser output power from 10 KW to 1-2 IW with similar results obtained.

Figure 3:
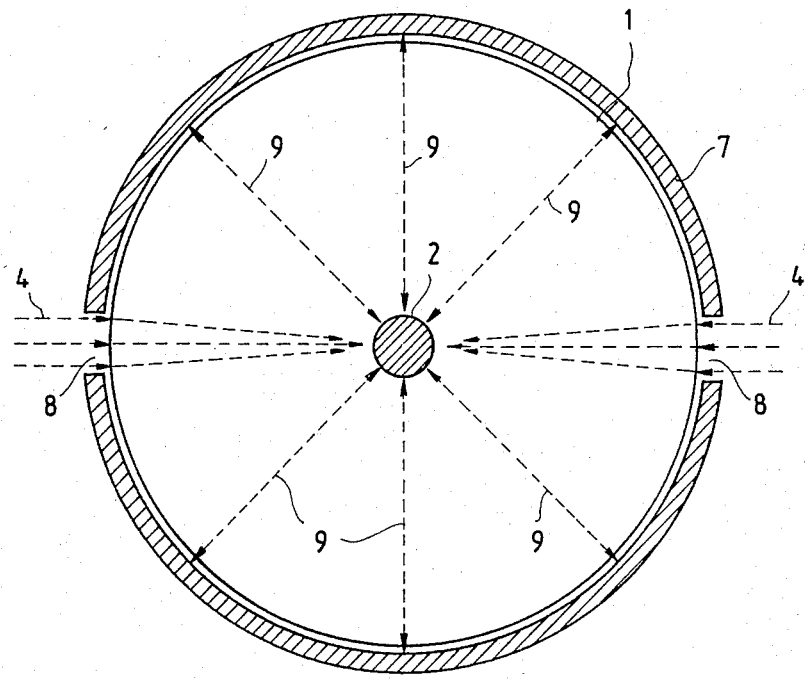
FIG. 3 is a schematic view showing a further embodiment of the invention in which a pressure-resistant body is entirely covered by a spherical concave mirror in a spaced relationship by which a heat loss involved during heating operation is reduced.

In FIG. 3, the laser beam is shown as irradiated from opposite directions but it may be irradiated from only one direction or from several directions.

In accordance with the third embodiment, energy loss can be reduced to a substantial extent as mentioned and thus a laser system can be made compact with an improved energy efficiency. Furthermore, even though long laser irradiation time is needed, the pressure-resistant body and the concave mirror can be cooled by a simple manner.

In the foregoing description, reference is mainly made to artificial diamond which requires super-high temperature and pressure conditions. For the manufacture of crystals of metal compounds, milder temperature and pressure conditions are sufficient. For instance, crystals of CdS, ZnSe, CdSe, ZnS and the like can be made by heating such materials at about 1800°-1900° C. These materials can be crystallized in a similar manner described with respect to the foregoing embodiments. Preparation of crystals of ZnS according to the invention is particularly described by way of example.

EXAMPLE 3

10 g of ZnS compound which contains Zn and S at a stoichiometrical ratio of 1:1 is weighed and vacuum-molded under pressure to give a sphere. This sphere is covered with a glass powder containing a binder which is heated to a temperature at which the glass powder alone is melted in a mold. If, for example, Pyrex glass 7740 by Corning Glass Works is used, the melting temperature is in the range of 900° to 1000°. The melted glass is cooled to form a transparent glass sphere having the ZnS nucleus therein. The amount of the glass is determined to be about 30 times by weight as great as the amount of the ZnS. By this, the resulting sphere has a radius of about 3 times the radius of the ZnS nucleus. In this case, the pressure resistance of the sphere body is $6-8 \times 10^3$ kg/cm$^2$, so that the body can withstand an internal pressure of $6-8 \times 10^4$/cm$^2$.

Thereafter, the nucleus is heated by YAG laser from outside to a temperature of about 1800°-1900° C. and output power of the laser is gradually lowered for cooling the resulting melt by which crystals of the ZnS compound can be obtained.

As will be seen from the foregoing description, the method of the present invention is particularly useful in producing crystals of materials which are high in vapor pressure at high temperature but cannot be melted at a normal pressure.

What is claimed is:
1. A method for producing crystals of a material which comprises the steps of:
  (a) providing a starting solid material capable of absorbing a laser beam energy;
  (b) completely surrounding said solid material with a substantially spherical body transparent to the energy such that said starting solid material is placed approximately at the center of said substantially spherical body as a nucleus;

(c) applying the laser beam energy from outside of said substantially spherical body until said starting solid material is heated and melted whereby a high internal pressure is produced by thermal expansion of said starting solid material being melted and is imposed on the melt, said laser beam energy, when applied to a surface of said substantially spherical body in parallel beams, being focused on said starting solid material by said substantially spherical body to cause said starting solid material to be heated and melted; and (d) cooling the melt, thereby forming crystals different from the crystals of said starting solid material.

2. A method according to claim 1, wherein said starting solid material is graphite, whereby the formed crystals are diamond.

3. A method according to claim 2, wherein the laser beam energy is applied from at least two directions.

4. A method according to claim 1, wherein said substantially spherical body is entirely composed of a material selected from the group consisting of quartz and glass which are transparent to a visible light laser beam.

5. A method according to claim 1, wherein at least a portion of said substantially spherical body which is transparent to the energy is made of a material selected from the group consisting of quartz, diamond, sapphire, and glass.

6. A method according to claim 1, wherein said substantially spherical body is composed entirely of a compound of the formula, $TlBr_xI_y$, in which $x+y=1$, and said laser beam energy is an infrared laser beam.

7. A method according to claim 1, wherein said substantially spherical body has a diameter at least ten times larger than the size of the nucleus.

8. A method according to claim 1, wherein said starting material is graphite and is heated in the presence of a catalyst for facilitating production of diamond therefrom.

9. A method according to claim 1, wherein said substantially spherical body is transparent to a laser beam and is covered with a round concave mirror in spaced relation with said body, said round concave mirror having at least one window through which the beam is passed, whereby the heat energy radiated from the melt is reflected toward the melt.

10. A method according to claim 9, wherein a cooling gas is passed through the space established between said body and said round concave mirror.

11. A method according to claim 1, wherein said starting material is a member selected from the group consisting of CdS, ZnSe, CdSe and ZnS.

* * * * *